United States Patent
Ravirala et al.

(10) Patent No.: US 9,411,755 B2
(45) Date of Patent: Aug. 9, 2016

(54) SOFTWARE DEBOUNCING AND NOISE FILTERING MODULES FOR INTERRUPTS

(71) Applicant: Microsoft Technology Licensing, LLC, Redmond, WA (US)

(72) Inventors: Murali Ravirala, Sammamish, WA (US); Omid Fatemieh, Redmond, WA (US); Gabriel Knezek, Seattle, WA (US); Youssef Barakat, Bothell, WA (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 180 days.

(21) Appl. No.: 13/867,094

(22) Filed: Apr. 21, 2013

(65) Prior Publication Data

US 2014/0317327 A1    Oct. 23, 2014

(51) Int. Cl.
*G06F 13/24* (2006.01)
*G06F 3/023* (2006.01)
*H03K 5/1254* (2006.01)

(52) U.S. Cl.
CPC ............... *G06F 13/24* (2013.01); *G06F 3/023* (2013.01); *H03K 5/1254* (2013.01)

(58) Field of Classification Search
CPC ........ G06F 9/4812; G06F 13/24; G06F 3/023
USPC ........................................................ 710/262
See application file for complete search history.

(56) References Cited

U.S. PATENT DOCUMENTS

| | | | |
|---|---|---|---|
| 5,315,539 A | | 5/1994 | Hawes |
| 7,218,250 B2 * | | 5/2007 | Laliberte et al. ............... 341/24 |
| 7,847,614 B2 | | 12/2010 | Taylor |
| 2006/0076984 A1 | | 4/2006 | Lu |
| 2007/0159363 A1 * | | 7/2007 | Suen et al. ..................... 341/26 |
| 2008/0162025 A1 | | 7/2008 | Groer et al. |
| 2009/0303088 A1 | | 12/2009 | Vile et al. |

FOREIGN PATENT DOCUMENTS

WO    95/33228  A1    12/1995

OTHER PUBLICATIONS

Contact-debouncing algorithm emulates Schmitt trigger—Published Date: Jul. 7, 2005 Proceedings: NA Author: Elio Mazzocca pp. 3 http://www.embedded.com/print/4324067.
Keyboards—Published Date: Dec. 17, 2004 Proceedings: NA Author: NA pp. 17 http://www.lintech.org/comp-per/04KB.pdf.

(Continued)

*Primary Examiner* — Glenn A Auve
(74) *Attorney, Agent, or Firm* — John Jardine; Doug Barker; Micky Minhas

(57) ABSTRACT

Systems and methods for debouncing a signal line within a computer device are provided. The mechanical nature of physical buttons and switches oftentimes present irregular or noisy signals on a signal line when depressed by a user. Thus, noise and/or irregular waveforms may be present on a signal line that is monitored to produce interrupt signals, when deemed valid and genuine. In many embodiments given herein, debounce modules and techniques set a debounce interval timer and/or a noise filtering interval timer in which debounce modules and/or techniques may note whether the signal line is still asserted (e.g., possibly a genuine interrupt signal) during the debounce interval timer and stable (e.g., no further interrupts have fired) during the noise filtering interval timer.

18 Claims, 5 Drawing Sheets

(56) References Cited

OTHER PUBLICATIONS

Software Button Debouncing and Ergonomics—Published Date: Jun. 2, 2005 Proceedings: NA Author: Nathaniel W. Crutcher pp. 8 http://ncrutcher.com/nat/button-debounce.html.

Tach Noise filtering—Published Date: Jan. 9, 2010 Proceedings: NA Author: NA pp. 6 http://www.msextra.com/doc/ms2extra/MS2-Extra_noise.html.

"International Search Report & Written Opinion for PCT Patent Application No. PCT/US2013/059565", Mailed Date: Dec. 2, 2013, Filed Date: Sep. 13, 2013, 8 Pages.

Simple Debounce Routine—Published Date: Sep. 30, 2008, Proceedings: NA, Author: Benoit, http://stackoverflow.com/questions/155071/simple-debounce-routine.

My favorite software debouncers—Published Date: Jun. 16, 2004, Proceedings: NA, Author: Jack Ganssle http://www.embedded.com/electronics-blogs/break-points/4024981/My-favorite-software-debouncers.

A Guide to Debouncing—Published Date: Aug. 2004, Proceedings: NA, Author: NA, http://www.ganssle.com/debouncing.pdf.

\* cited by examiner

SOFTWARE DEBOUNCING AND NOISE FILTERING MODULES FOR INTERRUPTS

BACKGROUND

The mechanical nature of physical buttons or switches often prevents smooth voltage transitions when they are pressed or released. This may tend to create short-lived bounces on the line before the voltage settles and may trigger spurious interrupts. It may be desirable that such interrupts be debounced to provide only one interrupt invocation for each press or release (e.g., to the device driver consuming the interrupt). Otherwise, the device driver (or other "consumer"), seeing the interrupt, might assume multiple presses and behave incorrectly.

SUMMARY

The following presents a simplified summary of the innovation in order to provide a basic understanding of some aspects described herein. This summary is not an extensive overview of the claimed subject matter. It is intended to neither identify key or critical elements of the claimed subject matter nor delineate the scope of the subject innovation. Its sole purpose is to present some concepts of the claimed subject matter in a simplified form as a prelude to the more detailed description that is presented later.

Systems and methods for debouncing a signal line within a computer device are provided. The mechanical nature of physical buttons and switches oftentimes present irregular or noisy signals on a signal line when depressed by a user. Thus, noise and/or irregular waveforms may be present on a signal line that is monitored to produce interrupt signals, when deemed valid and genuine. In many embodiments given herein, debounce modules and techniques set a debounce interval timer and/or a noise filtering interval timer in which debounce modules and/or techniques may note whether the signal line is still asserted (e.g., possibly a genuine interrupt signal) during the debounce interval timer and stable (e.g., no further interrupts have fired) during the noise filtering interval timer.

In one embodiment, a method for debouncing a signal line is described comprising: detecting an assertion of a signal on said signal line; masking said signal line; setting a first timer; upon the expiration of said first timer, unmasking said signal line; setting a second timer; upon the expiration of said second timer, noting if said signal line is still asserted; if said signal line is still asserted, invoking an interrupt signal. In another embodiment, if the signal line remained asserted and stable during the second timer, then an interrupt signal may be invoked.

In another embodiment, a system for debouncing a signal line is described comprising: a controller; a debounce module, said debounce module in communication with a signal line and capable of executing upon said controller; and wherein further said debounce module capable of: detecting an assertion of a signal on said signal line; masking said signal line; setting a first timer; upon the expiration of said first timer, unmasking said signal line; setting a second timer; upon the expiration of said second timer, noting if said signal line is still asserted; if said signal line is still asserted, invoking an interrupt signal. In another embodiment, if the signal line remained asserted and stable during the second timer, then an interrupt signal may be invoked.

Other features and aspects of the present system are presented below in the Detailed Description when read in connection with the drawings presented within this application.

BRIEF DESCRIPTION OF THE DRAWINGS

Exemplary embodiments are illustrated in referenced figures of the drawings. It is intended that the embodiments and figures disclosed herein are to be considered illustrative rather than restrictive.

DETAILED DESCRIPTION

Figure 1:
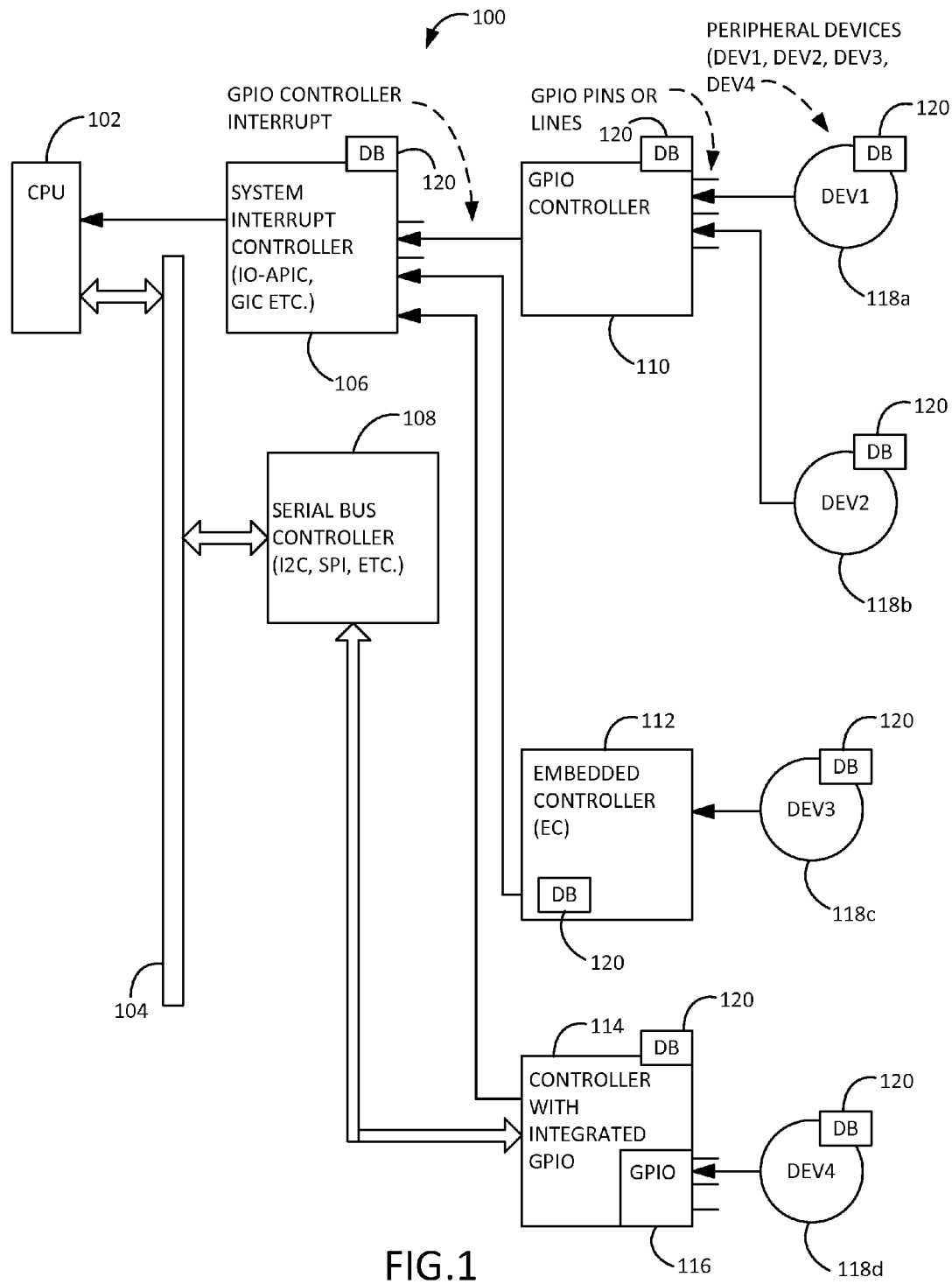
FIG. 1 depicts one embodiment of a computer device/system in which a debounce module may reside and execute at many possible points in the computer system.

As utilized herein, terms "component," "system," "interface," "controller", "modules" and the like are intended to refer to a computer-related entity, either hardware, software (e.g., in execution), and/or firmware. For example, any of these terms can be a process running on a processor, a processor, an object, an executable, a program, and/or a computer. By way of illustration, both an application running on a server and the server can be a component and/or controller. One or more components/controllers can reside within a process and a component/controller can be localized on one computer and/or distributed between two or more computers.

The claimed subject matter is described with reference to the drawings, wherein like reference numerals are used to refer to like elements throughout. In the following description, for purposes of explanation, numerous specific details are set forth in order to provide a thorough understanding of the subject innovation. It may be evident, however, that the claimed subject matter may be practiced without these specific details. In other instances, well-known structures and devices are shown in block diagram form in order to facilitate describing the subject innovation.

Introduction

Many possible factors may lead to spurious interrupts. For example, an interrupt line may be exposed to noise signals due to static or interference on the line, or incorrect firmware behavior for the device controlling the line. To measure a system's immunity to such noise signals, there exist industry-standard tests like the Electro-Static Discharge (ESD) that introduce random and periodic noise on the interrupt lines. Using effective noise filtering mechanisms, modern computer systems are expected to pass ESD tests and avoid misbehaviors resulting from acting on spurious interrupts.

Attempts to address the above problems fall into two broad categories, namely solutions implemented in both software and hardware. The most widely-adopted software solutions often involve sampling the interrupt line at some rate (e.g. every 1 millisecond) for a certain number of times (e.g. 5). If the line shows "asserted" on all those samples, the interrupt is deemed genuine. However, this approach may employ several higher magnitudes of CPU cycles to detect genuine interrupt and may not be able to filter periodic noise signals.

Hardware-based debouncing solutions may involve adding circuitry to suppress noise and bounces on the line. Thus, due to a potentially increased Bill-of-Materials (BOM) costs, software-based debouncing using fewer system resources may be preferred.

Overview

In many embodiments of the present application, there are systems and methods provided that tend to effectively filters out spurious bounces that occur during a genuine interrupt—as well as spurious interrupts due to random and periodic noise.

In one embodiment, an algorithm is provided that tends to perform accurate noise filtering while tending to consume a small amount of CPU resources. In one embodiment, the algorithm may only process a single physical interrupt to detect a genuine interrupt and two interrupts to detect a spurious interrupt. In one embodiment, the algorithm tends to be power efficient as it tends to allow the CPU to enter low-power during a first period of time (e.g., a debounce interval).

In some embodiments, the algorithm may leverage interrupt controller capabilities (e.g., reprogramming the line) to sample the line continuously instead of requiring the CPU to sample the line at fixed intervals. In some embodiments, the algorithm also introduces a second period of time (e.g., a noise filtering interval) for noise detection.

First Embodiment

FIG. 1 shows one exemplary embodiment where systems and/or methods of the present application may reside in an exemplary computer system. It should be appreciated that the techniques of software debouncing may be implemented in one or many of the components of a computing system—e.g., in one or more drivers, GPIO controllers, interrupt controllers, embedded controllers or other controllers. It should also be appreciated that the techniques of the present application may reside and/or execute in other components of a computing system as well.

FIG. 1 shows an exemplary computer system 100 which may comprise (in whole or in some combination thereof): CPU 102, system bus 104, system interrupt controller 106, bus controller 108, GPIO controller 110, embedded controller 112, controller 114 with integrated GPIO 116, and peripheral devices 118a, 118b, 118c and 118d. Debounce (DB) methods and/or controllers 120 may reside in any number of the above-mentioned components of computer system 100. It will be appreciated that such DB systems and/or methods may reside in other parts of a computer system as well.

DB modules, systems and/or methods may be executing on these components and be in communication with and/or monitoring signal lines for interrupt signals that may tend to be the source of signal bounce and noise. One embodiment of a DB solution is implemented as a software and/or firmware module debouncing that may effectively debounce interrupts. In another embodiment, a DB solution may be implemented to debounce—while also tending to ensure that noise/spurious interrupts may be appropriately filtered out. Such a DB embodiment may handle both random noise as well as periodic noise signals.

In one embodiment, a DB module may works as follows:

(1) Allow the interrupt line to stabilize for a debounce time period and/or duration—may be as specified in e.g., ACPI firmware. During this time, the line may be masked to ignore any additional interrupts generated due to bouncing. This interval is called the "debouncing interval". It should be appreciated that a suitable debounce time period may be based on a certain characteristics—e.g., system characteristics, line characteristics, signal characteristics or the like—but may be set in order for the interrupt line to typically stabilize.

(2) Unmask the interrupt line and monitor the line for a very short time period and/or duration—called the "noise filtering interval"—to validate that the line is indeed asserted and remains stable. It should be appreciated that a suitable noise filtering time period may be based on a certain characteristics—e.g., system characteristics, line characteristics, signal characteristics or the like—but may be set in order for the interrupt line to typically stabilize.

(3) If the line is asserted and stable during the entire noise filtering interval, then invoke the interrupt service routing (e.g., ISR) or otherwise, notify interested entities about the interrupt. Otherwise, the interrupt may be discarded as spurious.

In one embodiment, the debouncing interval may be defined by the platform vendor and/or component specifications—e.g., via ACPI firmware. This value may depend on the specification of the part (e.g. button, switch, etc.) but may approximately range between 5 and 25 milliseconds. Other intervals are, of course, possible.

The noise filtering interval may be defined by the implementation. In one implementation, it may be possible to choose the interval to be approximately 500 microseconds for memory-mapped GPIO controllers (or system interrupt controllers) and approximately 1 millisecond for non-memory-mapped controllers (e.g. GPIOs interfaced to the system via a serial communication bus like I2C). It should be understood that other intervals are possible, depending on the specifications and implementation. Thus, noise filtering interval may be very short relative to debounce interval.

Below is the detailed algorithm in pseudo-code format:

TABLE 1

Pseudo Code Embodiment

State represents the current state for the interrupt line in the debounce state machine. Possible values = { InitialInterruptState, DebounceTimerState, NoiseTimerState}
EventType represents the event that caused the debounce routine to be invoked. PossibleValues = { OnInterruptEvent, OnDebounceTimerEvent, OnNoiseTimerEvent}
   Initial conditions: For each interrupt,
      1) Define a mutual exclusion lock and set it to released (i.e. not acquired).
      2) Set the current interrupt epoch value as 0.
      3) Set the State = InitialInterruptState
DebounceInterrupt(int EventType) {
  Acquire mutual exclusion lock associated with this interrupt line
// Phase 1: When an interrupt fires (EventType = OnInterruptEvent) The
//    interrupt may correspond to initial interrupt or noise interrupt.
// On initial interrupt
If (EventType == OnInterruptEvent) && (State == InitialInterruptState), then:
  Advance the current interrupt epoch for the interrupt line.
  Mask the interrupt line
  Set State = DebounceTimerState
  Schedule a timer for the debounce interval specified. The interval is implementation defined.
  goto End      // Done Processing
// On noise interrupt
If (EventType == OnInterruptEvent) && (State == NoiseTimerState) , then:
  Advance the current interrupt epoch for the interrupt line.
  Cancel the noise interval timer
  Set State = InitialInterruptState
  Mask the interrupt line
  Reprogram the line to its original interrupt mode and polarity.
  Unmask the interrupt line.
  goto End   // Done Processing; note: interrupt discarded as spurious
  :
  (time elapses)
  :
// Phase 2: When the debounce timer fires (State == DebounceTimerState)
If (EventType == OnDebounceTimerEvent) && (State == DebounceTimerState), then:
  Reprogram the interrupt line in the following configuration:
    Interrupt mode = LevelSensitive, and TABLE 1-continued Pseudo Code Embodiment

```
        Interrupt polarity = <the opposite polarity of initial polarity>.
        Record the current interrupt epoch and associate it with noise interval
timer.
        Schedule a timer for noise filtering interval. The noise filtering interval is
implementation defined.
        Set State = NoiseTimerState
        Unmask the interrupt line
        goto End          // Done Processing
// Phase 3: When the noise interval timer fires (State == NoiseTimerState)
If (EventType == OnNoiseTimerEvent) && (State == NoiseTimerState),
then:
    If the current interrupt epoch matches the epoch recorded when the
noise timer was queued (in Phase 2), then:
        Invoke the interrupt service routine registered for the line
        Set State = InitialInterruptState
        Mask the interrupt line
        Reprogram the line to its original interrupt mode and polarity.
        Unmask the interrupt line.
    If the epoch values do not match, then:
        Ignore the timer fire // Implies a noise interrupt occurred
        goto End          // Done Processing
End:
Release the mutual exclusion lock associated with this interrupt line
}
```

Figure 2:
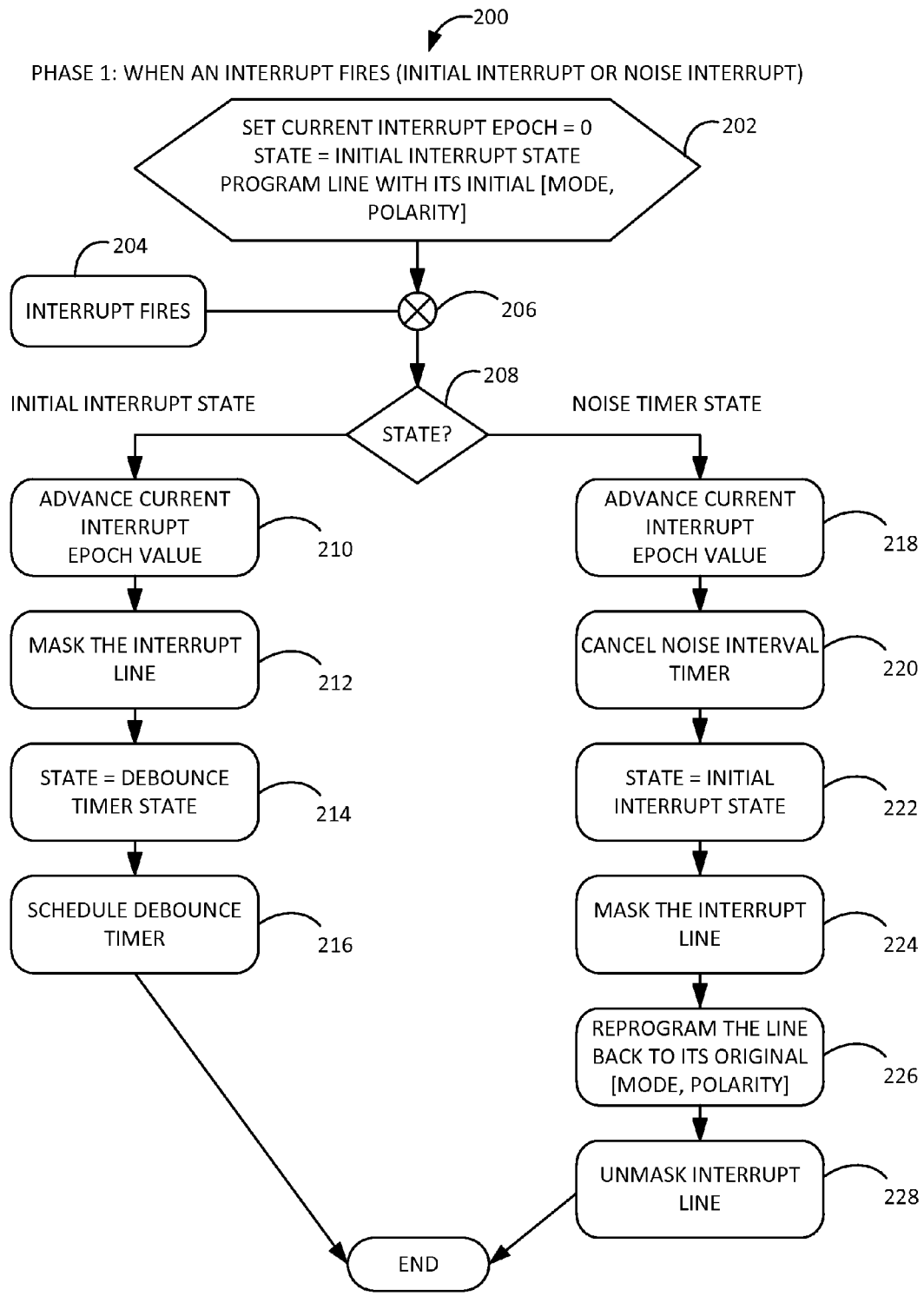
FIGS. 2 through 4 depict one embodiment of a debounce module in flowchart form.
Figure 3:
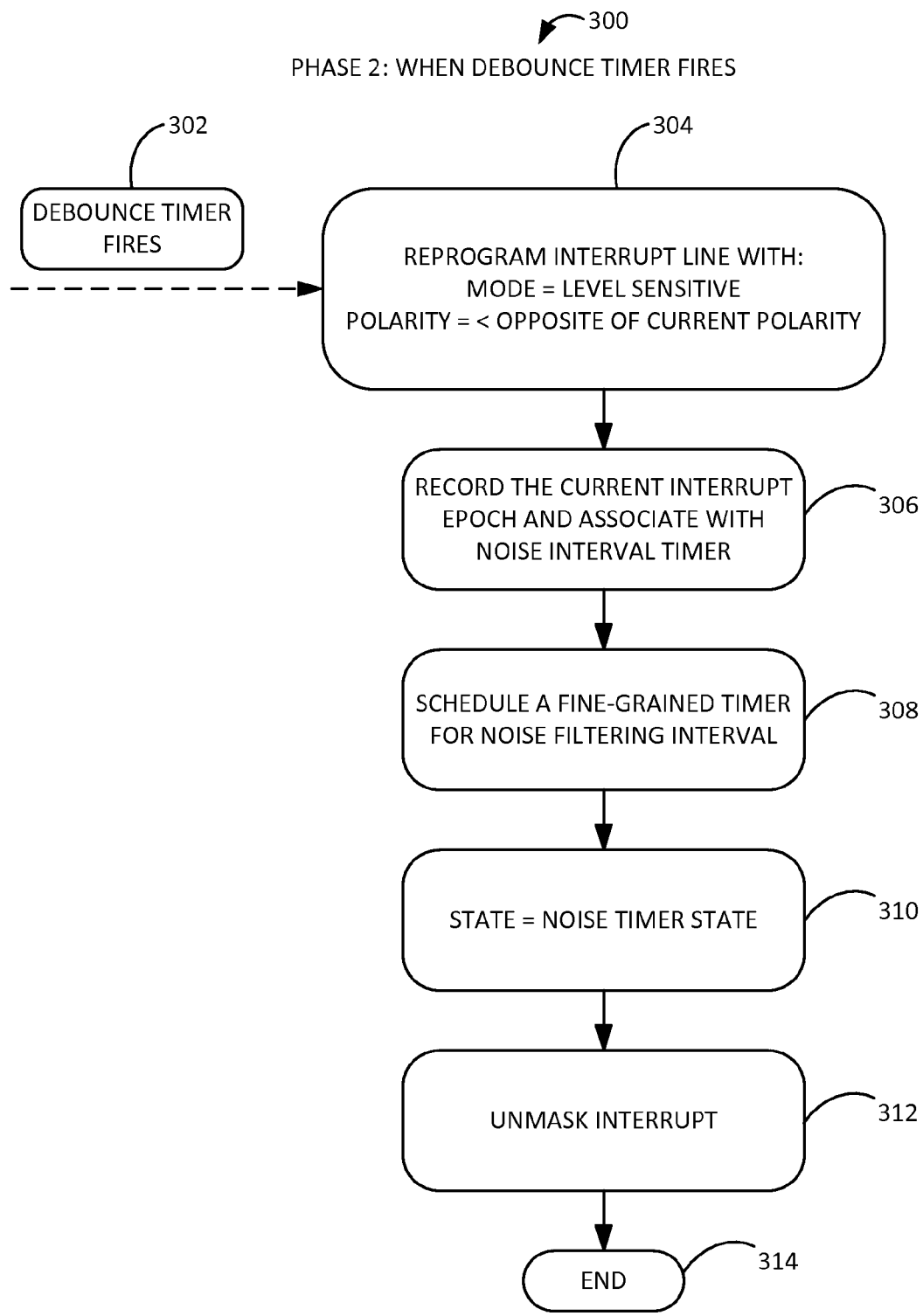
Figure 4:
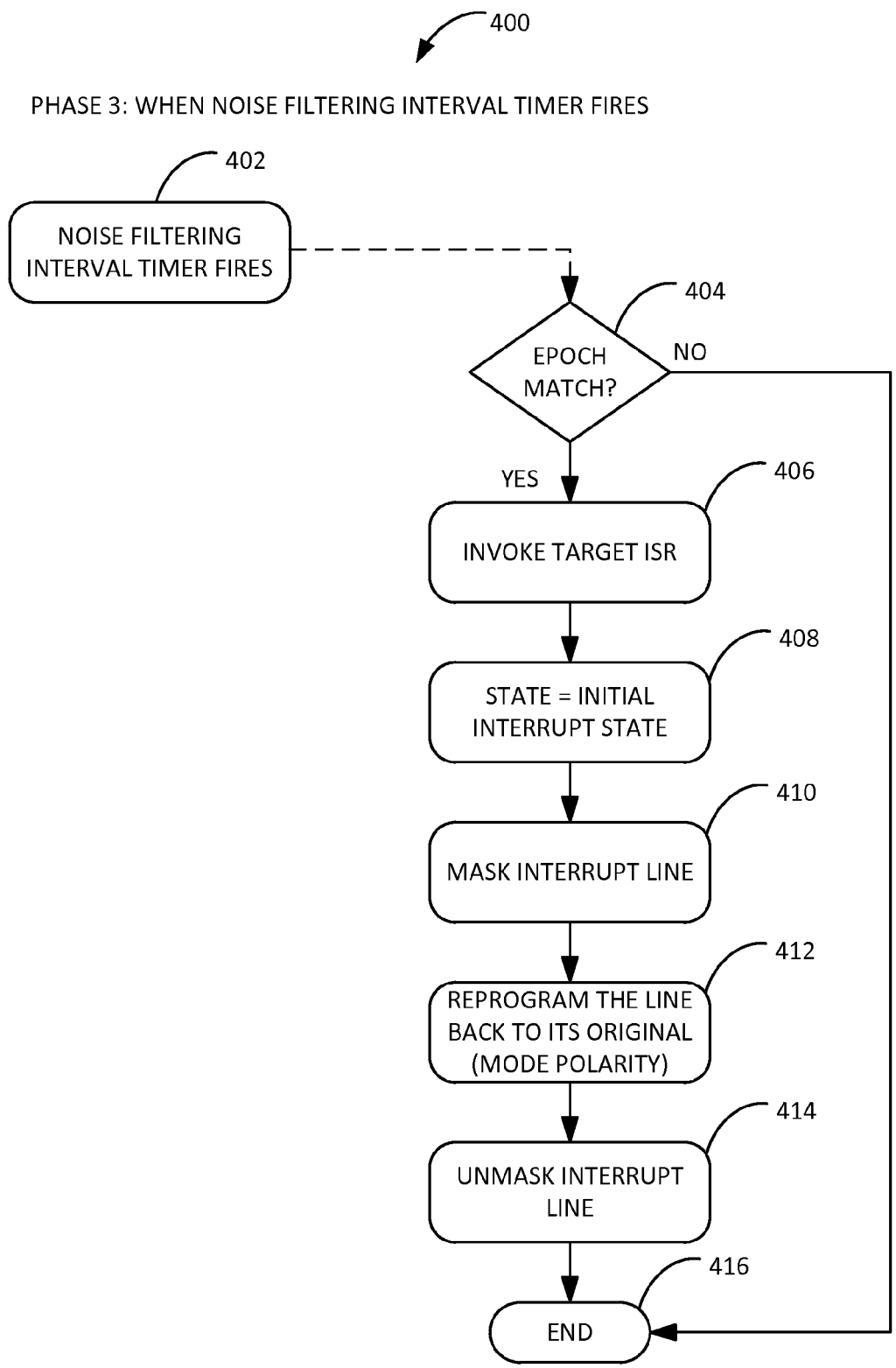

FIGS. 2 through 4 depict another embodiment of the DB techniques, as given in flowchart format. FIG. 2 represents the DB module in Phase 1, as acting upon startup (step 202) and when an initial interrupt on a line occurs (step 204). Step 208 determines in which state the DB module is operating—e.g., either during initial interrupt state or during a noise timer state. Initial interrupt state proceeds as steps 210 through 216; while noise timer state proceeds as steps 218 through 228.

FIG. 3 represents the DB module, as when the debounce timer fires at step 302—as possibly set at step 216 in FIG. 2. When the debounce timer fires, the DB module proceeds as step 304 through 314. During this phase (Phase 2), the polarity state may be reversed from its current state, the current interrupt epoch is recorded, the state of the DB is set to noise timer state, a timer is scheduled for the noise filtering interval and the interrupt line is unmasked.

FIG. 4 represents the DB module, as when the noise filtering interval timer fires at step 402 (Phase 3). When this occurs, DB module proceeds according to steps 404 through 416. In such case, if the epoch matches at step 404, then the interrupt is deemed valid and an ISR may be invoked at step 406. The DB module is then brought back to initial interrupt state, the interrupt line is masked while the line is reprogrammed back to its original polarity and then unmasked.

The DB module then is set back to its original states back in Phase 1 and ready for another interrupt to fire and the DB module proceeds substantially continuously as described above.

DB Module Behavior Embodiments

In one embodiment, the DB module may be invoked multiple times (e.g. three times) for whenever an interrupt to be debounced fires.

The first invocation may happen when the interrupt fires and starts a new debounce phase. The EventType may be OnInterruptEvent and State will match InitialInterruptState. In this state, the interrupt line gets masked, debounce timer is queued and the state is updated to DebounceTimerState.

The second invocation may happen when the debounce timer fires. The EventType will be OnDebounceTimerEvent and State may match DebounceTimerState. In this state, the line may be reprogrammed to look for the signal getting deasserted. The noise filter timer may be queued and the line is unmasked. The state may also be updated to NoiseTimerState. Since the line may be programmed to detect for the opposite polarity, if the line is not stable, an interrupt may fire before the noise filter timer expires. Apart from programming the line and detecting polarities, there may be other techniques for determining whether an interrupt has fired during (or prior to the expiration of) the noise filter timer—e.g., a sample/hold circuit or the like, may be able to capture the logic of this incident.

The third invocation may happen when either the noise timer expires or a noise interrupt arrives.

For genuine signals, the noise timer may fire. The EventType will be OnNoiseTimerEvent and State will match NoiseTimerState. The interrupt service routine may be invoked. The line may be reprogrammed back to its initial state and the state will be reset to InitialInterruptState.

In case of noise interrupts, the module may be invoked with EventType as OnInterruptEvent and State matching NoiseTimerState. In this case, interrupt line may be reprogrammed back to its original configuration and the state reset to InitialInterruptState. The noise timer may also be cancelled to prevent it from firing. It should be noted that the interrupt service routine registered for the line may not be invoked in this case and thereby the interrupt may be discarded as spurious.

It may be possible for noise timer to fire at the same time as an incoming noise interrupt. In this case, the module may be invoked a fourth time. The behavior may depend on the order in which the events happen—e.g., determined by which event acquires the mutual exclusion lock first.

If the noise timer fires after the noise interrupt is already processed, then the invocation may be ignored due to interrupt epoch mismatch as explained further below. If the noise interrupt arrives after noise timer fires, then the interrupt may be treated as the start of a new interrupt and processed accordingly.

Embodiment Employing Interrupt Epoch

In many cases, the noise interrupt may arrive well before the noise filtering interval timer fires and may get cancelled before it runs during Phase1 (State==NoiseTimerState) in the above module. However, it may be possible that the noise timer fires just before the module attempts to cancel the noise timer. In such cases, it may be assumed that the request to cancel the noise timer may fail and the debounce algorithm may be invoked for Phase 3 with (State==NoiseTimerState).

It may also be possible that noise interval timer expires but it actually runs much later when the debounce algorithm has progressed ahead to some later interrupt (e.g., likely for off-SoC GPIO controllers). To deal with such cases, the module may tend to maintain an "interrupt epoch value" that is incremented on every interrupt—e.g., regardless of whether it is the initial/new interrupt or a noise interrupt. If the noise interrupt already fired before the noise timer runs, then the epoch value won't match and the invocation will be ignored. In some embodiments, the interrupt epoch may be defined as a monotonically increasing integer value that may be incremented in an atomic manner.

Embodiments Supporting Edge-Triggered Only Controllers

In many embodiments, the above module may tend to rely on reprogramming the controller in level-triggered mode to detect whether the line remains asserted and stable during the noise filtering interval or not. Level detection may be preferred over edge detection in some cases, as edges may be missed if they happen during reprogramming or prior to it. Most GPIO controllers and primary interrupt controllers support level detection for interrupts. However, it may be possible that some interrupt controllers only support edge-detection for interrupts. To handle such cases, the reprogramming may be done to detect edge during Phase 2. Since edges may be missed, it may be possible that some noise interrupts may be missed. Thus, the module may function substantially on a "best efforts" basis for those types of controllers.

Examples of DB Module Processing

Figure 5:
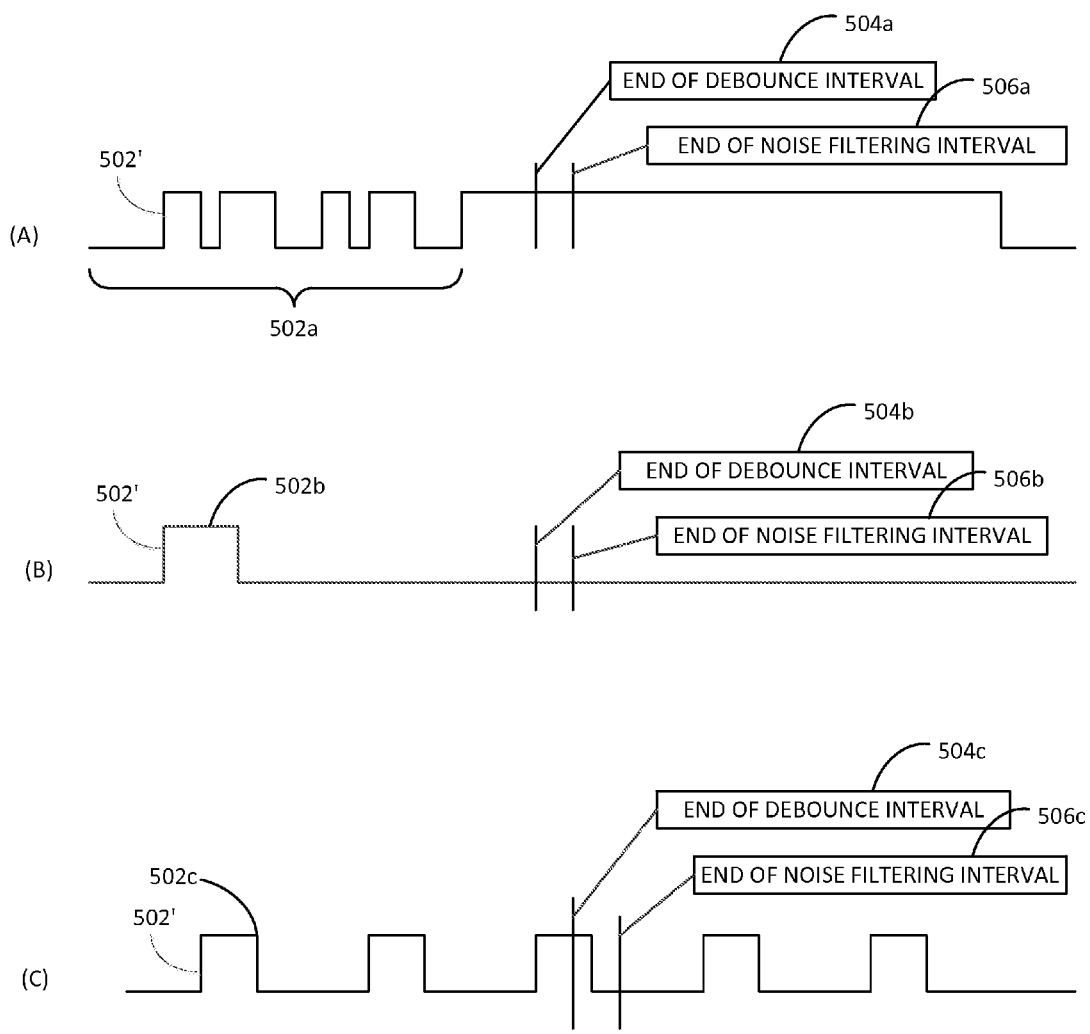
FIGS. 5A through 5C depict exemplary waveforms that might be resident on an interrupt line to help explain how the debounce module may process them.

Merely for expository purposes (and not meant to limit the scope of the present application), FIGS. 5A, 5B and 5C are exemplary waveforms representing some of possible cases that debouncing may need to handle. In these examples, it is assumed that the interrupt is configured as ActiveHigh (i.e. interrupt is asserted when the line goes HIGH). Other, different, assumptions are possible.

FIG. 5A depicts a waveform (e.g. progressing in time from left to right) in which a set of signals 502a are present on an interrupt line (e.g., possibly after a user has manually depressed a switch or button and bounce in evident on the interrupt line). This waveform may thus represent a typical signal having some noise at the beginning and then the line goes stable well before the debounce interval ends. As may be seen, the debounce interval may have been set—e.g., starting from the leading edge (502') of the first spike of 502a and ending with the line 504a. In addition, the noise filtering interval may have been set from line 504a and ending with the line 506a. In this case, the line will be sampled to be Active-High and will not cause an interrupt during the noise filtering interval. Thus, in this case, the interrupt would be considered valid and target ISR would be invoked.

It should be appreciated that the start of the first timer (e.g. debounce interval timer) may be different from the start of the leading edge of a first spike (e.g., a falling edge or another edge or the like) and that the length of the debounce interval may vary, depending on other factors (e.g. system characteristics or line characteristics). In addition, the noise filtering interval may start from another point in time—e.g., other than the end of the debounce interval. Also, the noise interval duration may be made to vary, depending on system and/or line characteristics. It may suffice for the purposes of the present application is that—however the first and second timers (e.g. debounce interval and noise filtering interval) are set, there is a good correlation between such two timers that helps to characterize a spike as either a genuine interrupt or a noise signal.

FIG. 5B depicts a waveform in which a single noise signal 502b is present on the line (e.g. possibly characterized by a very short duration). In this case, as the noise is short duration, the line will tend to revert to its quiescent state before the debouncing interval expires. The line would be sampled low at the end of debounce interval 504b and thus ignored by the DB module.

FIG. 5C depicts a waveform that may represent a glitchy line—e.g., where the noise may happen to occur roughly at some frequency. The frequency could be such that it overlaps with the debouncing interval. In this case, the line would be sampled HIGH. However, as the noise is expected to be much smaller than the noise filtering interval, this would tend to cause an interrupt during the noise filtering interval—which would result in an interrupt epoch mismatch. In such a case, the signal would tend to be ignored.

What has been described above includes examples of the subject innovation. It is, of course, not possible to describe every conceivable combination of components or methodologies for purposes of describing the claimed subject matter, but one of ordinary skill in the art may recognize that many further combinations and permutations of the subject innovation are possible. Accordingly, the claimed subject matter is intended to embrace all such alterations, modifications, and variations that fall within the spirit and scope of the appended claims.

In particular and in regard to the various functions performed by the above described components, devices, circuits, systems and the like, the terms (including a reference to a "means") used to describe such components are intended to correspond, unless otherwise indicated, to any component which performs the specified function of the described component (e.g., a functional equivalent), even though not structurally equivalent to the disclosed structure, which performs the function in the herein illustrated exemplary aspects of the claimed subject matter. In this regard, it will also be recognized that the innovation includes a system as well as a computer-readable medium having computer-executable instructions for performing the acts and/or events of the various methods of the claimed subject matter.

In addition, while a particular feature of the subject innovation may have been disclosed with respect to only one of several implementations, such feature may be combined with one or more other features of the other implementations as may be desired and advantageous for any given or particular application. Furthermore, to the extent that the terms "includes," and "including" and variants thereof are used in either the detailed description or the claims, these terms are intended to be inclusive in a manner similar to the term "comprising."

The invention claimed is:

1. A method for debouncing a signal line, the method comprising:
   detecting an assertion of a signal on said signal line;
   masking said signal line to ignore any additional signals on said signal line;
   setting a first timer;
   upon the expiration of said first timer, unmasking said signal line;
   setting a second timer;
   upon the expiration of said second timer, noting if said signal line is still asserted;
   if said signal line is still asserted, invoking an interrupt signal.

2. The method of claim 1 wherein detecting an assertion of a signal on said signal line further comprises:
   detecting an edge of a waveform on said signal line.

3. The method of claim 2 wherein detecting an edge of a waveform on said signal line further comprises:
   detecting a leading edge of a waveform on said signal line.

4. The method of claim 1 wherein setting a first timer further comprises:
   setting a debounce interval timer.

5. The method of claim 4 wherein setting a debounce interval timer further comprises:
   selecting a debounce time period, said debounce time period selected according to one a group, said group comprising: system characteristics, line characteristics, component specifications and signal characteristics.

6. The method of claim 4 wherein setting a debounce interval timer further comprises
   selecting a time period approximately 5 to 25 milliseconds.

7. The method of claim 1 wherein setting a second timer further comprises:

setting a noise filtering interval timer.

8. The method of claim 6 wherein setting a noise filtering interval timer further comprises:

selecting a noise filtering time period, said noise filtering time period selected according to one a group, said group comprising: system characteristics, line characteristics, component specifications and signal characteristics.

9. The method of claim 6 wherein setting a noise filtering interval timer further comprises:

selecting a time period approximately 0.5 to 1 milliseconds.

10. The method of claim 1 wherein noting if said signal line is still asserted further comprises:

noting if said signal line is stable during the period of said second timer.

11. The method of claim 10 wherein noting if said signal line is stable during the period of said second timer further comprises:

detecting whether an interrupt has fired during the period of the second timer.

12. The method of claim 11 wherein detecting whether an interrupt has fired during the period of the second timer further comprises:

noting whether an epoch value has changed during the period of the second timer; and if said epoch value has not changed, then noting that an interrupt did not fire during said period of the second timer.

13. The method of claim 10 wherein if said signal line is still asserted, invoking an interrupt signal further comprises:

if said signal line is still asserted and is stable during the period of said second timer, invoking an interrupt signal.

14. A system for debouncing a signal line, said system comprising:

a controller;

a debounce module, said debounce module in communication with a signal; and wherein further said debounce module configured to:

detect an assertion of a signal on said signal line;

mask said signal line to ignore any additional signals on said signal line;

set a first timer;

upon the expiration of said first timer, unmask said signal line;

set a second timer;

upon the expiration of said second timer, note if said signal line is still asserted;

if said signal line is still asserted, invoke an interrupt signal.

15. The system of claim 14 wherein said debounce module is configured to detect a leading edge of a waveform on said signal line.

16. The system of claim 14 wherein said debounce module is further configured to set a debounce interval time for said first timer; and said debounce interval time comprising one of a group, said group comprising: time selected from system characteristics, time selected from line characteristics, time selected from component specifications, time selected from signal characteristics and a time period of approximately 5 to 25 milliseconds.

17. The system of claim 16 wherein said debounce module is further configured to set a noise filtering interval time for said second timer; and said noise filtering interval time comprising one of a group, said group comprising: time selected from system characteristics, time selected from line characteristics, time selected from component specifications, time selected from signal characteristics and a time period of approximately 0.5 to 1 milliseconds.

18. The system of claim 17 wherein said debounce module is further configured to note if said signal line is still asserted and noting if said signal line is stable during the period of said second timer; and said debounce module is configured to invoke an interrupt signal if said signal line is still asserted and stable during the period of said second timer.

\* \* \* \* \*